United States Patent [19]

Furukawa

[11] Patent Number: 5,489,848
[45] Date of Patent: Feb. 6, 1996

[54] MAGNETIC RESONANCE IMAGING APPARATUS

[75] Inventor: Hiroshi Furukawa, Tokyo, Japan

[73] Assignee: Kabushiki Kaisha Toshiba, Kanagawa, Japan

[21] Appl. No.: 417,453

[22] Filed: Apr. 5, 1995

Related U.S. Application Data

[63] Continuation of Ser. No. 115,856, Sep. 2, 1993, abandoned.

[30] Foreign Application Priority Data

Sep. 8, 1992 [JP] Japan ..................................... 4-239553

[51] Int. Cl.⁶ .................................................. G01V 3/00
[52] U.S. Cl. .................................... 324/318; 128/653.5
[58] Field of Search ................... 324/318, 322, 324/307, 309; 128/653.5; 335/299, 296

[56] References Cited

U.S. PATENT DOCUMENTS

| | | | |
|---|---|---|---|
| 4,652,824 | 3/1987 | Oppelt | 324/318 |
| 5,084,676 | 1/1992 | Saho et al. | 324/318 |
| 5,132,618 | 7/1992 | Sugimoto | 324/318 |
| 5,179,338 | 1/1993 | Laskaris et al. | 324/318 |

FOREIGN PATENT DOCUMENTS 63-246146 of 0000 Japan.

*Primary Examiner*—Louis M. Arana
*Attorney, Agent, or Firm*—Limbach & Limbach; Ronald L. Yin

[57] ABSTRACT

In a magnetic resonance imaging apparatus a superconductive magnet is disposed in a first vacuum vessel defined by an outer cylinder and an inner cylinder. Another cylinder is coaxially disposed in the inner cylinder of the first vacuum vessel to form a second vacuum vessel. A gradient coil is disposed in the second vacuum vessel to prevent the noise from transmitting outside the second vacuum vessel.

19 Claims, 6 Drawing Sheets

MAGNETIC RESONANCE IMAGING APPARATUS

This is a continuation of application Ser. No. 08/115,856 filed Sep. 2, 1993, now abond.

BACKGROUND OF THE INVENTION

This invention relates to a magnetic resonance imaging (MRI) apparatus and, more particularly, an MRI apparatus which employs a gradient coil unit disposed in a vacuum vessel for noise reduction.

An MRI apparatus detects magnetic resonance signals from nuclei (e.g. proton) in an object and reconstructs a tomographic image of a desired slice position of the object. An MRI apparatus holds a great advantage in medical use because of non-invasiveness or non X-ray dosing.

In general, an MRI apparatus comprises a cylindrical gradient coil unit inside a magnet unit including a cylindrical superconductive magnet. The superconductive magnet contained in a cryostat filled with cooling medium is disposed inside a hollow cylindrical vacuum vessel. Inside the gradient coil unit a radio-frequency (RF) coil is disposed.

According to a predetermined pulse sequence, the RF coil applies a radio-frequency field and the gradient coil unit applies a gradient field to an object. Subsequently a magnetic resonance phenomenon occurs in the object and a magnetic resonance signal is detected by the RF coil. A magnetic resonance (MR) image is obtained by reconstructing the detected MR signal.

The gradient coil unit includes three channels of gradient coils producing gradient fields along x, y and z axis, respectively. These three gradient coils are switched frequently and rapidly. When switching, the gradient coils and the magnet vessel supporting the gradient coil unit vibrate. This vibration causes a shock sound. This shock sound echoes in an imaging bore which a patient is placed and the patient feels uncomfortable, anxious or fear.

To reduce this noise, a number of arrangements have been offered. For example, gradient coils are covered by soundproof materials. However, this is not successful to reduce the noise sufficiently.

U.S. Pat. No. 4,652,365 discloses an MRI apparatus in which gradient coils are disposed inside a vacuum vessel for maintaining the superconductive condition of a superconductive magnet to prevent the noise to transmit outside the vessel. This arrangement requires the breakage of the vacuum when adjusting the positions of the gradient coils after the MRI system is assembled. Moreover, when cooling medium for the gradient coils leaks in the vacuum vessel, the vacuum condition gets worse which causes evaporation of the cooling medium of the superconductive magnet.

Japanese patent application No. 62-79889 describes an MRI apparatus which includes a first vacuum vessel for a superconductive magnet and a second vacuum vessel, in which gradient coils are disposed, coaxially provided in a bore of the first vacuum vessel. This arrangement requires a complex manufacturing process and causes a low cost-performance because two separate vacuum vessels are provided. Moreover, the imaging bore can not be sufficiently large and the patient feels oppression in the imaging bore.

SUMMARY OF THE INVENTION

An object of the present invention is to provide an improved MRI apparatus comprising a gradient coil system for producing a gradient field.

Another object of the present invention is to provide an improved MRI apparatus comprising a gradient coil system not transmitting the noise in an imaging bore.

According to the present invention, there is provided an MRI apparatus comprising:

magnet means for producing a static magnetic field, having a magnet disposed between an outer cylinder and a first inner cylinder;

vacuum vessel means for forming a vacuum space having a second inner cylinder coaxially disposed in said first cylinder defining the vacuum space between said first and second cylinder;

gradient means for producing a gradient magnetic field, having a gradient coil disposed in said vacuum space; and radio-frequency means for transmitting a radio-frequency pulse and for receiving a magnetic resonance signal induced from an object.

According to the present invention, there is also provided an MRI apparatus comprising:

a magnet system for producing a static magnetic field, having a superconductive magnet disposed between an outer cylinder and a first inner cylinder;

a gradient system for producing a gradient magnetic field, including a second inner cylinder coaxially disposed in said first cylinder for forming a vacuum space between said first and second cylinder, a pair of end plates for closing the vacuum space disposed at the ends of said first and second inner cylinder, a gradient coil disposed in said vacuum space, and a pair of supporting member for adjustably supporting said gradient coil at end portions of said first inner cylinder, said second inner cylinder and said end plates being detachably disposed; and a radio-frequency coil system for transmitting a radio-frequency pulse and for receiving a magnetic resonance signal induced from an object.

According to the present invention, there is also provided an MRI apparatus comprising:

magnet means for producing a static magnetic field, having a bore at the center thereof;

gradient means for producing a gradient magnetic field, having a cylinder coaxially disposed in said bore for forming a vacuum space between said magnet means and said cylinder, and having a gradient coil disposed in said vacuum space; and radio-frequency means for transmitting a radio-frequency pulse and for receiving a magnetic resonance signal induced from an object.

BRIEF DESCRIPTION OF THE DRAWINGS

For a more complete understanding of the present invention, reference will be made to the following detailed explanations in conjunction with the accompanying drawings in which.

DESCRIPTION OF THE PREFERRED EMBODIMENTS

Figure 1:
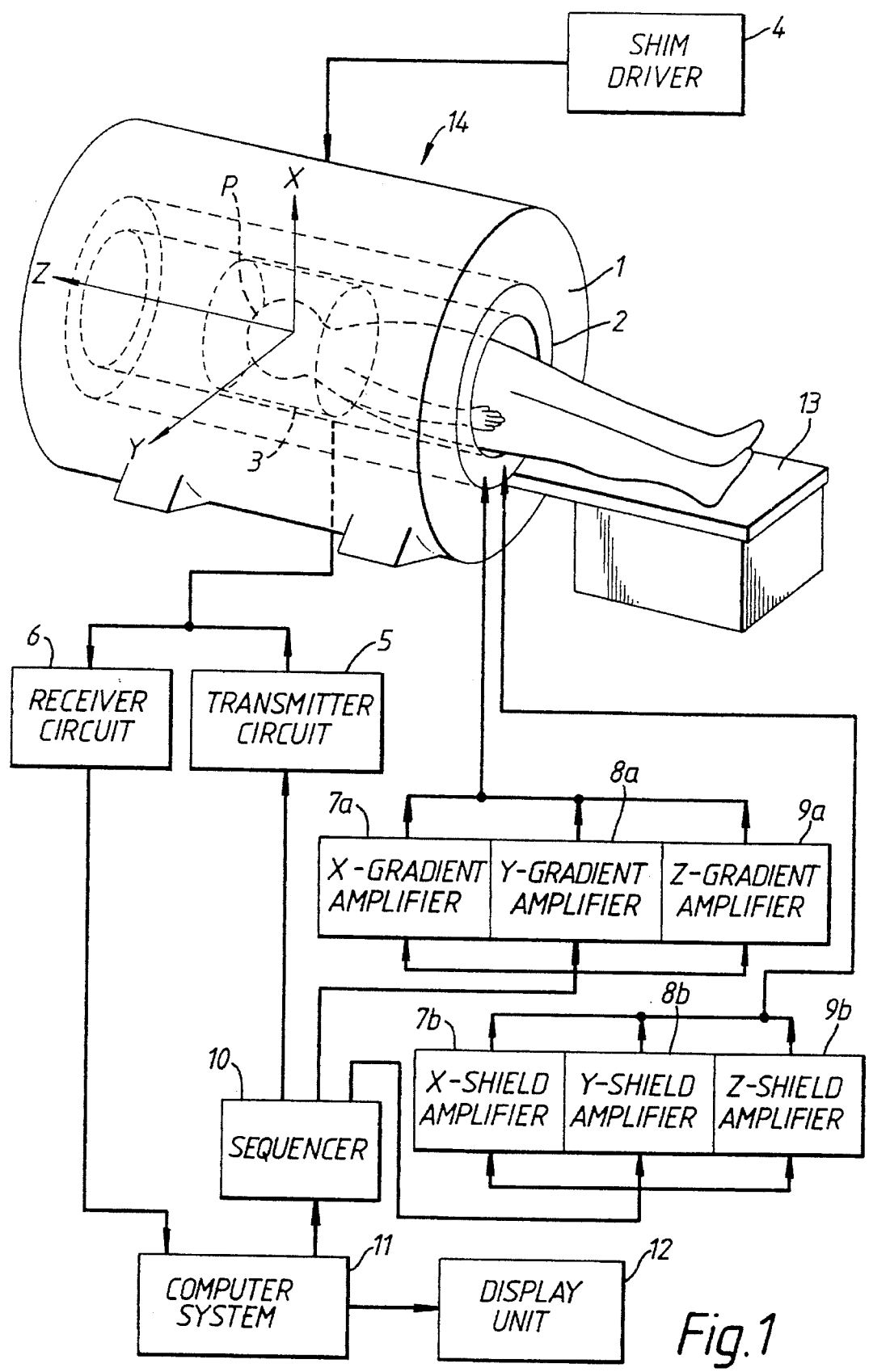
FIG. 1 is a schematic diagram of an MRI apparatus of a first embodiment of the present invention.

Referring now to FIG. 1, a first embodiment of an MRI apparatus of the present invention will be described below.

A gantry 14 comprises a magnet system 1, a gradient coil system 2, and a transmitter/receiver coil 3. A high intensity, uniformity and stability is required for a static magnetic field produced by the magnet system 1. To achieve the desirable condition of the static magnetic field, three kinds of magnets, a superconductive magnet, a permanent magnet and a resistive conductive magnet, have been utilized in known MRI systems. In this embodiment a superconductive magnet having an excellent magnetic field characteristic is used. The gradient coil system 2 comprises x-, y- and z-gradient coils. The transmitter/receiver coil 3 applies radio-frequency (RF) pulses and receives magnetic resonance (MR) signals. Transmitting and receiving may be performed by a transmitter coil and a receiver coil, respectively.

A shim driver 4 applies electric power to a shim coil system (not shown) for producing shimming magnetic fields to minimize the inhomogeneity of the static field. The transmitter/receiver coil 3 is driven by a transmitter circuit 5 when RF pulses are applied, and connected to a receiver circuit 6 when receiving MR signals.

The gradient coil system 2 is driven by three channels (x, y and z) of gradient amplifiers 7a, 8a and 9a. The gradient coil system 2 is also connected to three channels of shield amplifiers 7b, 8b and 9b, as described below.

A sequencer 10 controls the gradient amplifiers 7a–9a, the shield amplifiers 7b–9b and the transmitter circuit 5 to respectively produce gradient fields Gx, Gy, and Gz and an RF pulse according to a predetermined pulse sequence programmed in the sequencer 10.

A computer system 11 controls the sequencer 10, and inputs MR signals received by the receiver circuit 6 to reconstruct an MR image of an object by a predetermined signal processing. A display unit 12 displays the reconstructed MR image.

An object P lying on a couch 13 is placed in an imaging region, a spherical region in which a uniform magnetic field for imaging is formed and imaging is possible therein, in a gantry 14.

Figure 2:
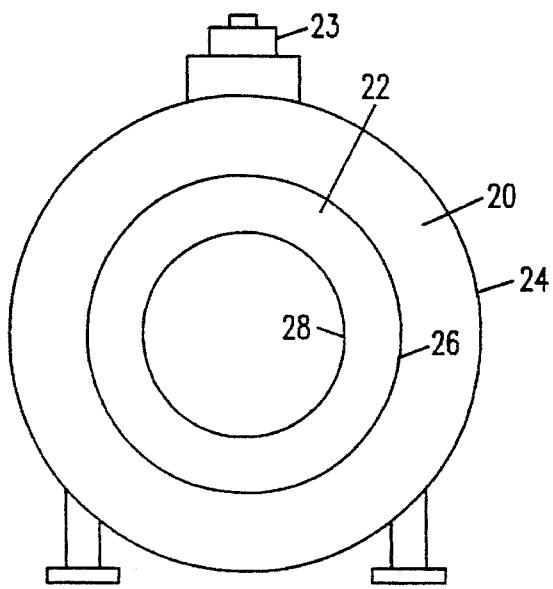
FIG. 2 is a front view of a gantry of the MRI apparatus of the first embodiment of the present invention.
Figure 3:
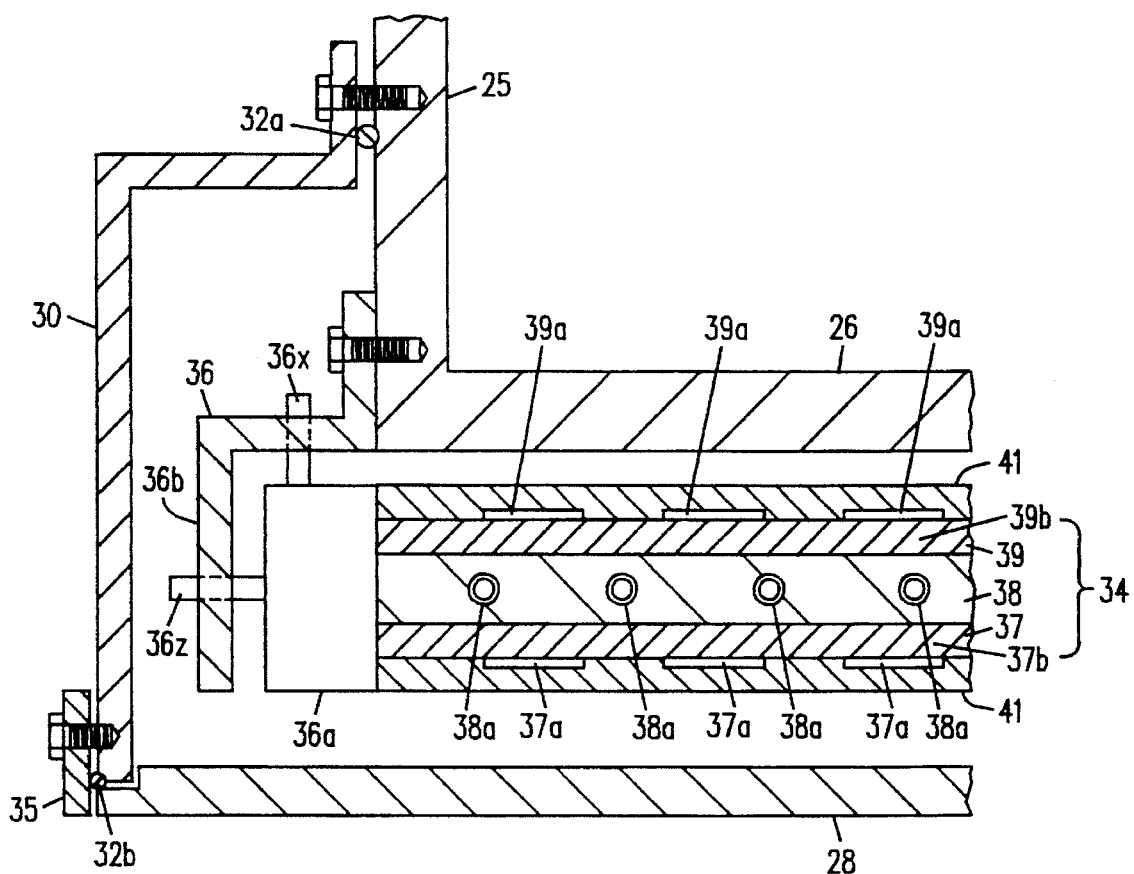
FIG. 3 is a partial sectional side view of the gantry of the first embodiment of the present invention.

FIG. 2 shows a front view of the gantry 14 and FIG. 3 shows a partial sectional side view thereof. The magnet system 1 comprises a first vacuum vessel 20 for containing a superconductive magnet therein, and the gradient coil system 2 comprises a second vacuum vessel 22 coaxially disposed inside the first vacuum vessel 20 for containing a gradient coil unit 34. These vessels 20 and 22 are made of non-magnetic material. Preferably, the vessel 20 is made of aluminum and the vessel 22 is made of FRP (Fiber Reinforced Plastics). On the upper portion of the gantry 14 an inlet port 23 is mounted for supplying cooling medium, such as liquid helium, for maintaining the superconductive condition of the superconductive magnet therethrough.

As illustrated in FIGS. 2 and 3, the first vacuum vessel 20 is a hollow cylindrical vessel comprising an outer cylinder 24 and an inner cylinder 26, disposed coaxially. A vacuum space is defined between the outer cylinder 24 and the inner cylinder 26 and is closed with a pair of end plates 25 at the end portions. Not shown in FIG. 3, inside the vessel 20, between the outer cylinder 24 and the inner cylinder 26, a superconductive magnet is disposed.

Inside the inner cylinder 26 a second vacuum vessel 22 is provided. Similar to the first vacuum vessel 20, the second vacuum vessel 22 is hollow cylindrical. The inner cylinder 26 of the first vacuum vessel 20 is also used as the outer cylinder of the second vessel 22. An inner cylinder 28 is coaxially disposed inside the inner cylinder 26 of the first vacuum vessel 20. The space between the inner cylinder 26 and the inner cylinder 28 is closed with a pair of end plates 30. At a joint portion of the end plate 30, O-rings 32a and 32b made of fluoroelastomer, for example, are disposed for sealing. A flange 35 is provided at the joint portion of the end plate 30 and the inner cylinder 28 for fixing the inner cylinder 28.

Figure 4A:
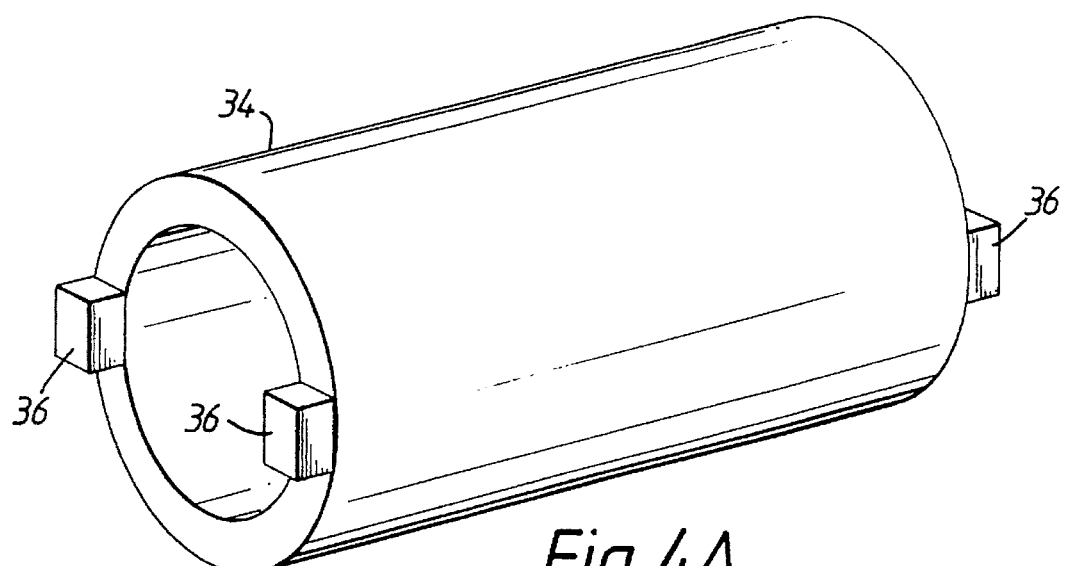
FIG. 4A is a schematic perspective view of a gradient coil unit and FIG. 4B is a perspective view of a supporting member of the gradient coil unit.
Figure 4B:
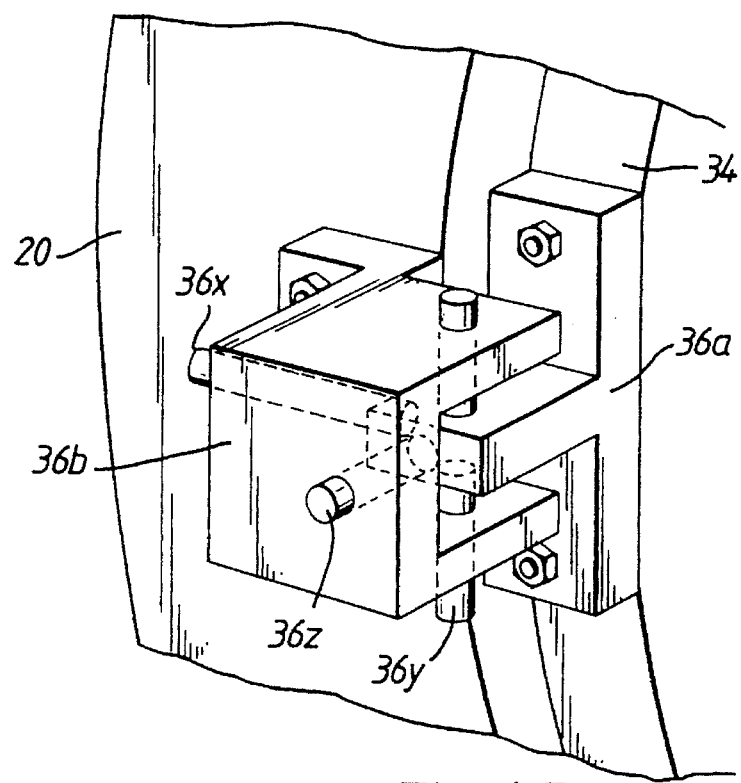

Supporting members 36 are disposed at the both end portions of the gradient coil unit 34 and the first vacuum vessel 20 for adjustably supporting the gradient coil unit 34. A detailed mechanism of the supporting member 36 is shown in FIGS. 4A and 4B. Two supporting members 36 are mounted at each end portion. Blocks 36a and 36b are mounted at the end portions of the gradient coil unit 34 and the first vacuum vessel 20, respectively. Distances between the blocks 36a and 36b along x-, y- and z-axis can be adjusted by screws 36x, 36y and 36z, respectively.

Figure 5:
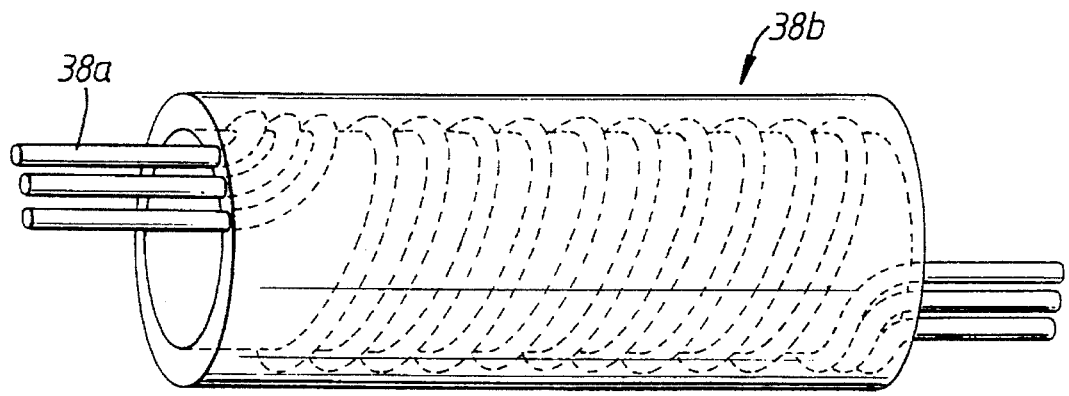
FIG. 5 shows a winding pattern of cooling pipes of the first embodiment of the present invention.

The gradient coil unit 34 comprises a main coil unit 37, a cooling unit 38 and a shield coil unit 39, each of the cylindrical units being disposed coaxially as illustrated in FIG 3. The main coil unit 37 comprises x-, y- and z-gradient coils (not shown), each connected to the gradient amplifiers 7a–9a, respectively. The main coil unit 37 applies a gradient field with a predetermined intensity and timing in the imaging bore. Coil windings 37a of the gradient coils are provided on an inner surface of a cylindrical substrate 37b. The coil windings 37a are made of copper and the substrate 37b is made of an insulating material, such as FRP. The shield coil unit 39 applies a shield magnetic field for shielding the gradient field outside the gradient coil unit 34. This type of shield system is disclosed in U.S. Pat. No. 4,733,189. Coil patterns 39a of the shield coil unit 39 are provided on an outer surface of a cylindrical substrate 39b. The cooling unit 38 for cooling the gradient coil unit 34 is disposed between the main coil unit 37 and the shield coil unit 39. The cooling unit 38 comprises cooling pipes 38a for leading cooling fluid, such as water, therethrough. An example of the winding pattern of the cooling pipes 38a is shown in FIG. 5. A plurality of parallel pipes are spirally wound and molded into a cylindrical shape with resin 38b. The cooling pipes 38a are made of Teflon (trademark), for example. After three cylindrical units 37, 38 and 39 are manufactured, they are coaxially disposed, then the inner surface of the main coil unit 37 and the outer surface of the shield coil unit 39 are molded with resin 41.

Figure 6:
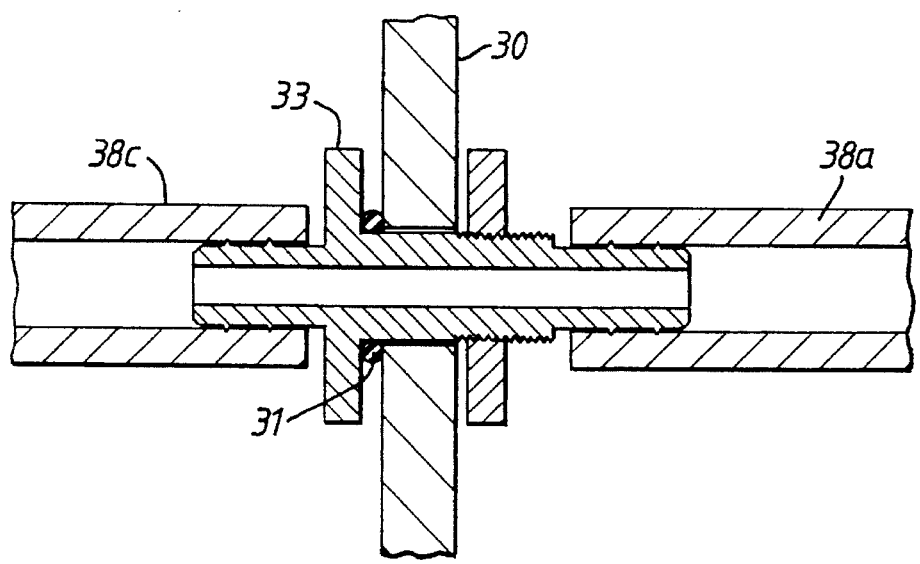
FIG. 6 is a sectional view of a joint portion of a cooling pipe of the first embodiment of the present invention.

Cooling fluid is supplied through couplers 33, each connected to cooling pipes 38a and 38c, from outside the second vacuum vessel 22, as illustrated in FIG. 6. The couplers 33 are made of non-magnetic metal, such as brass. An O-ring 31 is disposed between the end plate 30 and each of the couplers 33 for sealing.

In the embodiment described above, since a part of the vacuum vessel for the magnet is also used as a part of the vacuum vessel for the gradient coil unit, the noise from the gradient coils can be reduced keeping a large imaging bore with a simple structure and a high cost-performance. Since the gradient coil unit and the superconductive magnet are respectively provided in separate vacuum vessels and the vacuum conditions are maintained separately, the position of the gradient coil unit can be adjusted without breaking the vacuum condition of the vessel for the magnet. For adjusting the position of the gradient coil unit, the end plates 30 and the inner cylinder 28 are detachably mounted to disassemble the second vacuum vessel. After adjustment of the gradient coil the vessel 22 can be reassembled by attaching the end plate 30 and evacuating the air inside the vessel 22.

Moreover, the inner cylinder 28 of the second vessel 22 may be used as an RF coil providing RF coil windings thereon. This arrangement enables a larger imaging bore comparing to the embodiment described above.

Figure 7:
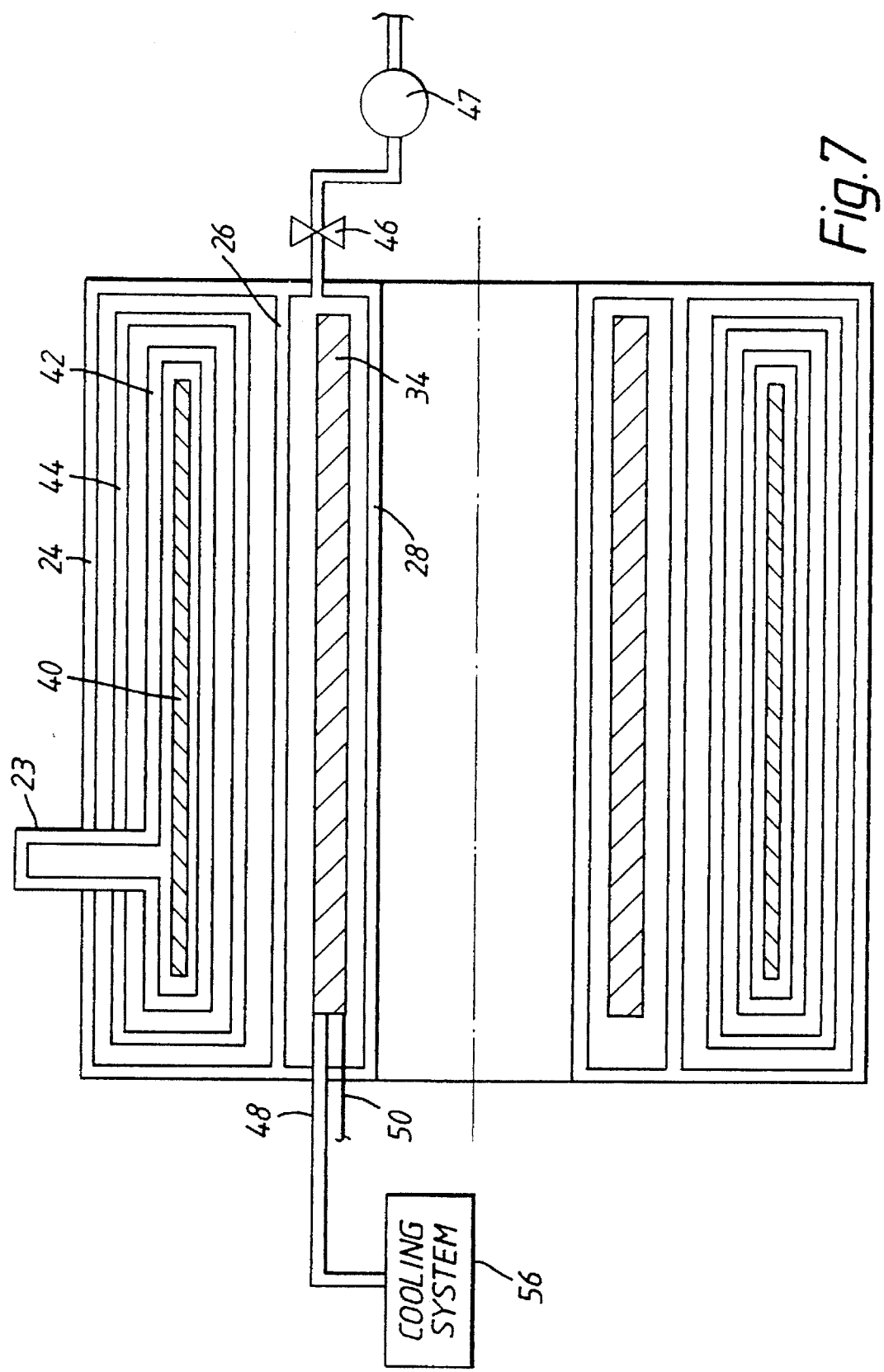
FIG. 7 is a sectional view of the gantry of the first embodiment of the present invention.

FIG. 7 is a sectional view of the vacuum vessels 20 and 22. A superconductive magnet 40 is disposed in a liquid helium vessel 42, filled with cooling medium, such as liquid helium. The inlet port 23 is connected to the liquid helium vessel 42. The liquid helium vessel 42 is surrounded by a radiation thermal shield 44, which is disposed in the first vacuum vessel 20 between the outer cylinder 24 and the inner cylinder 26. The gradient coil unit 34 is disposed in the second vacuum vessel 22 between the inner cylinder 26 of the first vacuum vessel 20 (also an outer cylinder of the second vacuum vessel 22) and the inner cylinder 28. A pump 47 evacuates the air inside the second vessel 22 via an electromagnetic valve 46 after the position of the gradient coil unit 34 is adjusted. Desirably, the pump 47 evacuates frequently to maintain the vacuum condition in $10^{-1}$–$10^{-2}$ torr. For example, the pump 47 is automatically turned on by the control of the computer 11 when the system, which comprises units capable of being turned off when imaging is not taking place at night (e.g. the gradient amplifiers 7–9, the sequencer 10, the display unit 12), is turned off. The pump 47 is off when the system is working to prevent receiving undesirable noise. The electromagnetic valve 46 prevents the air to flow into the vacuum vessel 22 when the pump 47 is off. Cooling medium is circulated by a cooling system 56, comprising a heat exchanger and a compressor (not shown), through the pipes 38a and 38c (shown in FIGS. 5 and 6). Each of the main coils 37 and the shield coils 39 are respectively connected to the gradient amplifiers 7a–9a and the shield amplifiers 7b–9b via a conductor 50. A valve and a pump for evacuating is also mounted to the first vacuum vessel 20 (not shown).

Figure 8:
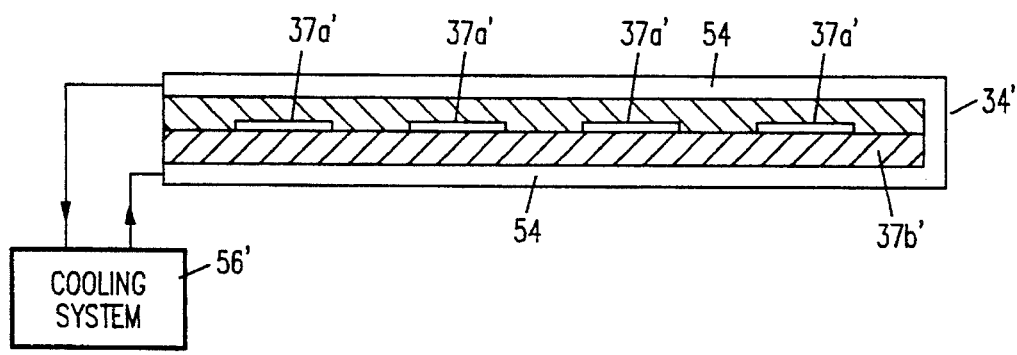
FIG. 8 shows a schematic diagram of a second embodiment of the present invention.

FIG. 8 shows a second embodiment of the present invention. A gradient coil unit 34' comprises coil windings 37a' on a surface of a cylindrical substrate 37b'. Since in this embodiment a shield coil unit is not provided, the gradient coil unit 34' can be thinner as compared to the first embodiment as shown in FIG. 3. Therefore, cooling pipes 54 can be provided on both sides of the gradient coil unit 34' to obtain a higher cooling effect.

Figure 9:
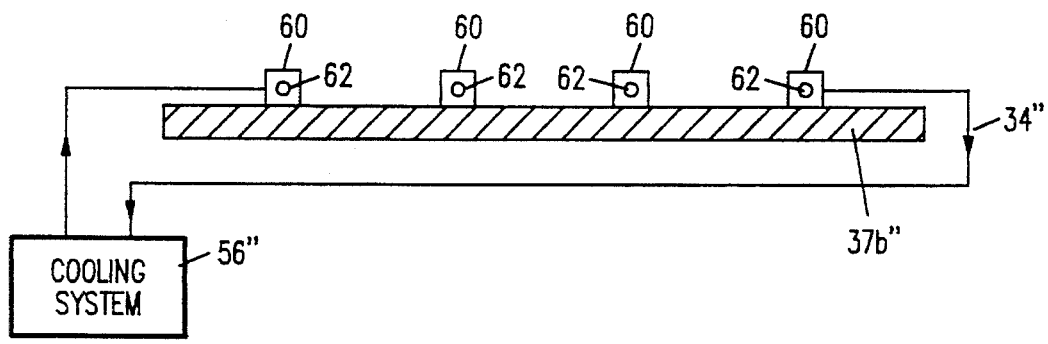
FIG. 9 shows a schematic diagram of a third embodiment of the present invention.

FIG. 9 shows a third embodiment of the present invention. Hollow conductors 60 as coil windings are provided on a surface of a cylindrical substrate 37b". Cooling medium is circulated by a cooling system 56" through a hole 62 of each hollow conductor 60.

The invention has been described in connection with certain illustrated embodiments. However, numerous modifications and variations of the present invention are possible in light of the above teachings. It is therefore to be understood that, within the scope of the appended claims, the present invention can be practiced in a manner other than as specifically described herein.

What is claimed is:

1. A magnetic resonance imaging apparatus comprising:

magnet means for producing a static magnetic field, having a magnet disposed between an outer cylinder and a first inner cylinder;

vacuum vessel means for forming a vacuum space having a second inner cylinder coaxially disposed in said first cylinder defining the vacuum space between said first and second cylinder;

gradient means for producing a gradient magnetic field, having a gradient coil disposed in said vacuum space wherein the gradient coil is separated from said first and second cylinders by the vacuum space.; and radio-frequency means for transmitting a radio-frequency pulse and for receiving a magnetic resonance signal induced from an object.

2. The magnetic resonance imaging apparatus according to claim 1 wherein said magnet is a superconductive magnet.

3. The magnetic resonance imaging apparatus according to claim 1 wherein said second inner cylinder is detachably disposed at said first inner cylinder.

4. The magnetic resonance imaging apparatus according to claim 1 wherein said vacuum vessel further comprises a pair of end plates for closing the vacuum space that are detachably disposed to the ends of said first and second inner cylinder.

5. The magnetic resonance imaging apparatus according to claim 1 wherein said gradient means further comprises a shield coil for shielding a magnetic field outside said gradient means.

6. The magnetic resonance imaging apparatus according to claim 1 further comprising cooling means for cooling said gradient means, having a cooling pipe for leading cooling medium therethrough.

7. The magnetic resonance imaging apparatus according to claim 6 wherein said cooling pipe is disposed on both surfaces of said gradient coil.

8. The magnetic resonance imaging apparatus according to claim 5 further comprising cooling means for cooling said gradient means, having a cooling pipe for leading cooling medium therethrough, disposed between said gradient coil and said shield coil.

9. The magnetic resonance imaging apparatus according to claim 8 wherein said cooling pipe is spirally wound.

10. The magnetic resonance imaging apparatus according to claim 1 wherein said gradient coil comprises a hollow conductor having a hole for leading cooling medium therethrough.

11. The magnetic resonance imaging apparatus according to claim 1 further comprising supporting means for supporting said gradient coil inside said first inner cylinder.

12. The magnetic resonance imaging apparatus according to claim 11 wherein said supporting means comprises a pair of supporting members for supporting said gradient coil at end portions of said magnet means.

13. The magnetic resonance imaging apparatus according to claim 12 wherein said pair of supporting members support said gradient coil adjustably.

14. The magnetic resonance imaging apparatus according to claim 1 further comprising evacuating means for evacuating a space between said first and second inner cylinder.

15. The magnetic resonance imaging apparatus according to claim 14 further comprising control means for controlling the evacuating means such that said evacuating means is on while a system including said gradient means and said radio-frequency means is off.

16. The magnetic resonance imaging apparatus according to claim 14 further comprising control means for controlling the evacuating means such that said evacuating means is off while a system including said gradient means and said radio-frequency means is on.

17. The magnetic resonance imaging apparatus according to claim 1 wherein said radio-frequency means comprises a coil winding disposed on said second inner cylinder.

18. A magnetic resonance imaging apparatus comprising:

a magnet system for producing a static magnetic field, having a superconductive magnet disposed between an outer cylinder and a first inner cylinder;

a gradient system for producing a gradient magnetic field, including a second inner cylinder coaxially disposed in said first cylinder for forming a vacuum space between said first and second cylinder, a pair of end plates for closing the vacuum space disposed at the ends of said first and second inner cylinder, a gradient coil disposed in said vacuum space wherein the gradient coil is separated from said first and second cylinders by the vacuum space, and a pair of supporting members for adjustably supporting said gradient coil at end portions of said first inner cylinder, said second inner cylinder and said end plates being detachably disposed; and a radio-frequency coil system for transmitting a radio-frequency pulse and for receiving a magnetic resonance signal induced from an object.

19. A magnetic resonance imaging apparatus comprising:

magnet means for producing a static magnetic field, having a bore at the center thereof;

gradient means for producing a gradient magnetic field, having a cylinder coaxially disposed in said bore for forming a vacuum space between said magnet means and said cylinder, and having a gradient coil disposed in said vacuum space wherein the gradient coil is separated from said first and second cylinders by the vacuum space; and radio-frequency means for transmitting a radio-frequency pulse and for receiving a magnetic resonance signal induced from an object.

* * * * *